(12) United States Patent
Fujita et al.

(10) Patent No.: US 7,869,274 B2
(45) Date of Patent: Jan. 11, 2011

(54) SEMICONDUCTOR MEMORY DEVICE

(75) Inventors: Katsuyuki Fujita, Yokohama (JP);
Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 12/343,805

(22) Filed: Dec. 24, 2008

(65) Prior Publication Data
US 2009/0168576 A1 Jul. 2, 2009

(30) Foreign Application Priority Data
Dec. 28, 2007 (JP) .............................. 2007-340580

(51) Int. Cl.
*G11C 11/34* (2006.01)
(52) U.S. Cl. .............................. 365/185.05; 365/185.2; 365/185.11; 365/63
(58) Field of Classification Search ............ 365/185.05, 365/185.11, 185.2, 63, 205
See application file for complete search history.

(56) References Cited

U.S. PATENT DOCUMENTS

| 6,567,330 | B2 |   | 5/2003 | Fujita et al. |
|---|---|---|---|---|
| 6,608,772 | B2 | * | 8/2003 | Ooishi .......................... 365/63 |
| 6,650,584 | B2 | * | 11/2003 | Cowles ....................... 365/201 |
| 6,947,344 | B2 | * | 9/2005 | Suh ............................. 365/205 |
| 7,145,811 | B2 |   | 12/2006 | Ohsawa |
| 7,269,084 | B2 |   | 9/2007 | Hatsuda et al. |

OTHER PUBLICATIONS

Takashi Ohsaw, et al., "An 18.5ns 128Mb SOI DRAM with a Floating Body Cell", ISSCC Digest of Technical Papers, Session 25, Dynamic Memory, Feb. 2005, 3 Pages.
Tsugio Takahashi, et al., "A Multigigabit DRAM Technology with $6F^2$ Open-Bitline Cell, Distributed Overdriven Sensing, and Stacked-Flash Fuse", IEEE Journal of Solid-State Circuits, vol. 36, No. 11, Nov. 2001, pp. 1721-1727.

* cited by examiner

*Primary Examiner*—Son dinh
(74) *Attorney, Agent, or Firm*—Oblon, Spivak, McClelland, Maier & Neustadt, L.L.P.

(57) ABSTRACT

A memory includes: first sense amplifiers arranged in a first interval of an arrangement of memory cell arrays, each being connected to first bit lines corresponding to two memory cell arrays provided at both sides of the first sense amplifier; second sense amplifiers arranged in a second interval of the arrangement of the memory cell arrays, each being connected to second bit lines corresponding to two memory cell arrays at both sides of the second sense amplifier; edge arrays provided beside both ends of an arrangement of the memory cell arrays, the edge arrays generating only the reference data; and edge sense amplifiers provided between the arrangement of the memory cell arrays and the edge arrays, wherein the edge sense amplifier detects data from the memory cell array at one end of the memory cell arrays based on the reference data from one of the edge arrays.

19 Claims, 12 Drawing Sheets

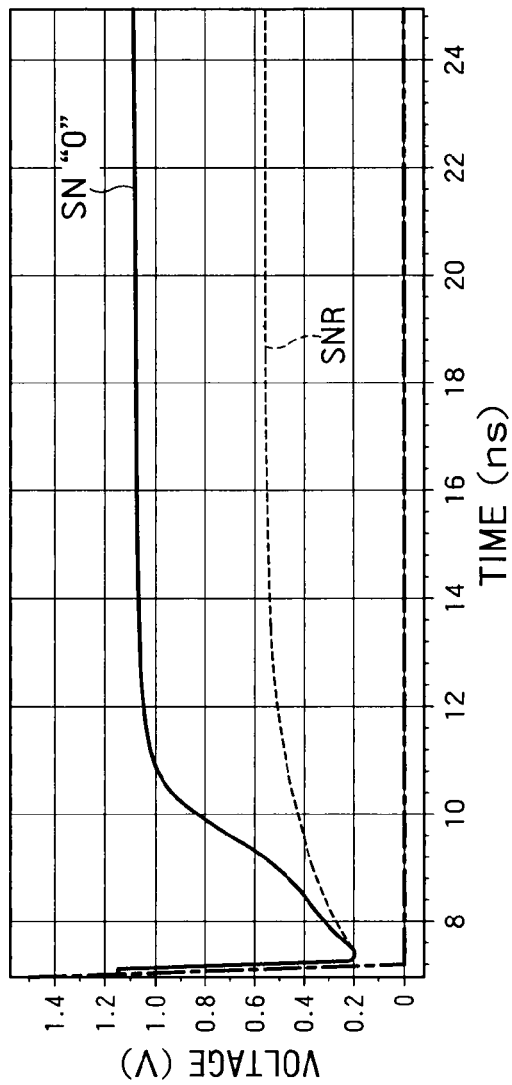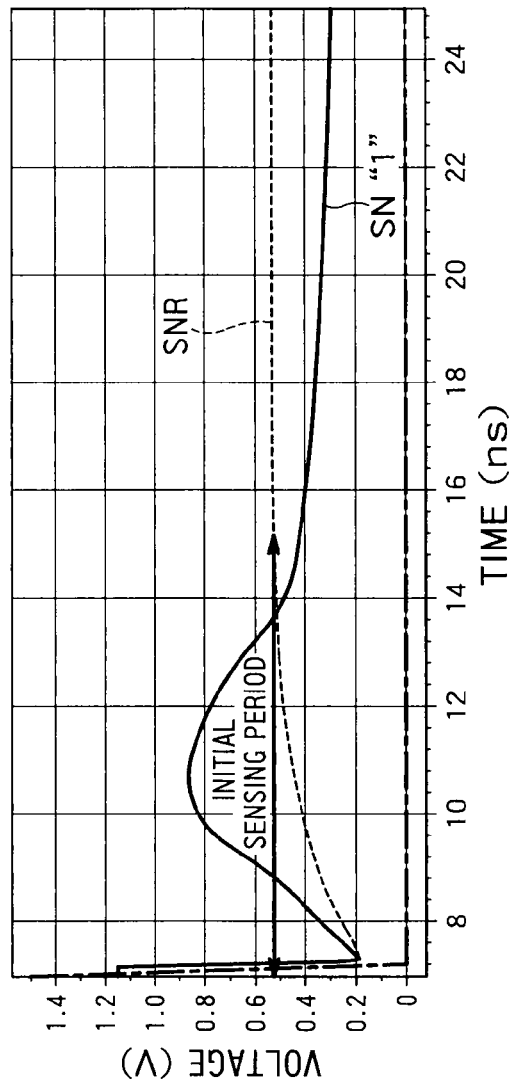
FIG. 11A
FIG. 11B

SEMICONDUCTOR MEMORY DEVICE

CROSS-REFERENCE TO RELATED APPLICATION

This application is based upon and claims the benefit of priority from the prior Japanese Patent Applications No. 2007-340580, filed on Dec. 28, 2007, the entire contents of which are incorporated herein by reference.

FIELD OF THE INVENTION

The present invention relates to a semiconductor memory device, and for example relates to an FBC (Floating Body Cell) memory device that stores data based on the number of carriers within a floating body.

RELATED ART

In recent years, there has been an FBC memory device as a semiconductor memory device expected as a memory alternative to a 1T (Transistor)-1C (Capacitor) DRAM. The FBC memory device has an FET (Field Effect Transistor) formed to include a floating body (hereinafter, also called "body") on an SOI (Silicon On Insulator) substrate. The FBC memory device stores data "1" or data "0" based on the number of majority carriers accumulated in this body.

For example, in an FBC including N-FETs, a state of a large number of holes accumulated in the body is set as data "1", and a state of a small number of holes accumulated in the body is set as data "0". A memory cell storing the data "0" is called a "0" cell, and a memory cell storing the data "1" is called a "1" cell.

Generally, a DRAM including a 1T-1C is configured in a crosspoint type having memory cells arranged at intersections between bit lines and word lines. To operate this DRAM in a one-cell/bit mode, a memory cell array needs to be configured by an open bit line system. In this case, a sense amplifier needs to employ a so-called double-ended arrangement. Because the furthest memory-cell array in the double-ended arrangement is connected to a sense amplifier at only one side, a memory capacity of the furthest memory-cell array decreases.

In the FBC, when a memory cell array is configured in the crosspoint type and also when the memory cells are operated in the one-cell/bit mode, a sense amplifier also needs to employ a double-ended arrangement. Therefore, the FBC also has the same problem as that of the DRAM.

SUMMARY OF THE INVENTION

A semiconductor memory device according to an embodiment of the present invention comprises:

a plurality of memory cell arrays having a plurality of memory cells two-dimensionally arranged, each of the memory cell comprising a source, a drain, and a gate, including a floating body in an electrically floating state, and storing data based on number of carriers within the floating body;

a plurality of word lines connected to the gates of the memory cells and arranged towards a first direction;

a plurality of first bit lines and a plurality of second bit lines respectively connected to the sources or the drains of the memory cells, and arranged alternately towards a second direction intersecting with the first direction;

first sense amplifiers arranged in a first interval of an arrangement of the memory cell arrays, each first sense amplifier being connected to the first bit lines respectively corresponding to two memory cell arrays provided at both sides of the first sense amplifier, each first sense amplifier detecting data from one of the two memory cell arrays on the basis of reference data from the other of the two memory cell arrays;

second sense amplifiers arranged in a second interval of the arrangement of the memory cell arrays, each second sense amplifier being connected to the second bit lines respectively corresponding to two memory cell arrays at both sides of the second sense amplifier, each second sense amplifier detecting data from one of the two memory cell arrays on the basis of reference data from the other of the two memory cell arrays;

edge arrays provided beside both ends of an arrangement of the memory cell arrays, the edge arrays generating only the reference data; and edge sense amplifiers provided between the arrangement of the memory cell arrays and the edge arrays, wherein the edge sense amplifier detects data from the memory cell array at one end of the memory cell arrays based on the reference data from one of the edge arrays.

A method of driving a semiconductor memory device according to an embodiment of the present invention, the semiconductor memory device comprising: a plurality of memory cell arrays formed by having a plurality of memory cells arranged two dimensionally, the memory cells including floating bodies in electrically floating states; a plurality of word lines connected to gates of the memory cells; a plurality of first bit lines and a plurality of second bit lines respectively connected to sources or drains of the memory cells; edge arrays provided beside both ends of an arrangement of the memory cell arrays; and edge sense amplifiers provided between the arrangement of the memory cell arrays and the edge arrays, the method comprises:

detecting data from a memory cell array at one end of the arrangement of the memory cell arrays based on reference data from one of the edge arrays.

BRIEF DESCRIPTION OF THE DRAWINGS

FIGS. 11A and 11B show results of a simulation showing a read operation of the sense amplifier S/A when the short-circuit switch Tshort is disconnected simultaneously with the starting of the initial sensing operation.

DETAILED DESCRIPTION OF THE INVENTION

Embodiments of the present invention will be explained below in detail with reference to the accompanying drawings, Note that the present invention is not limited thereto.

First Embodiment

Figure 1:
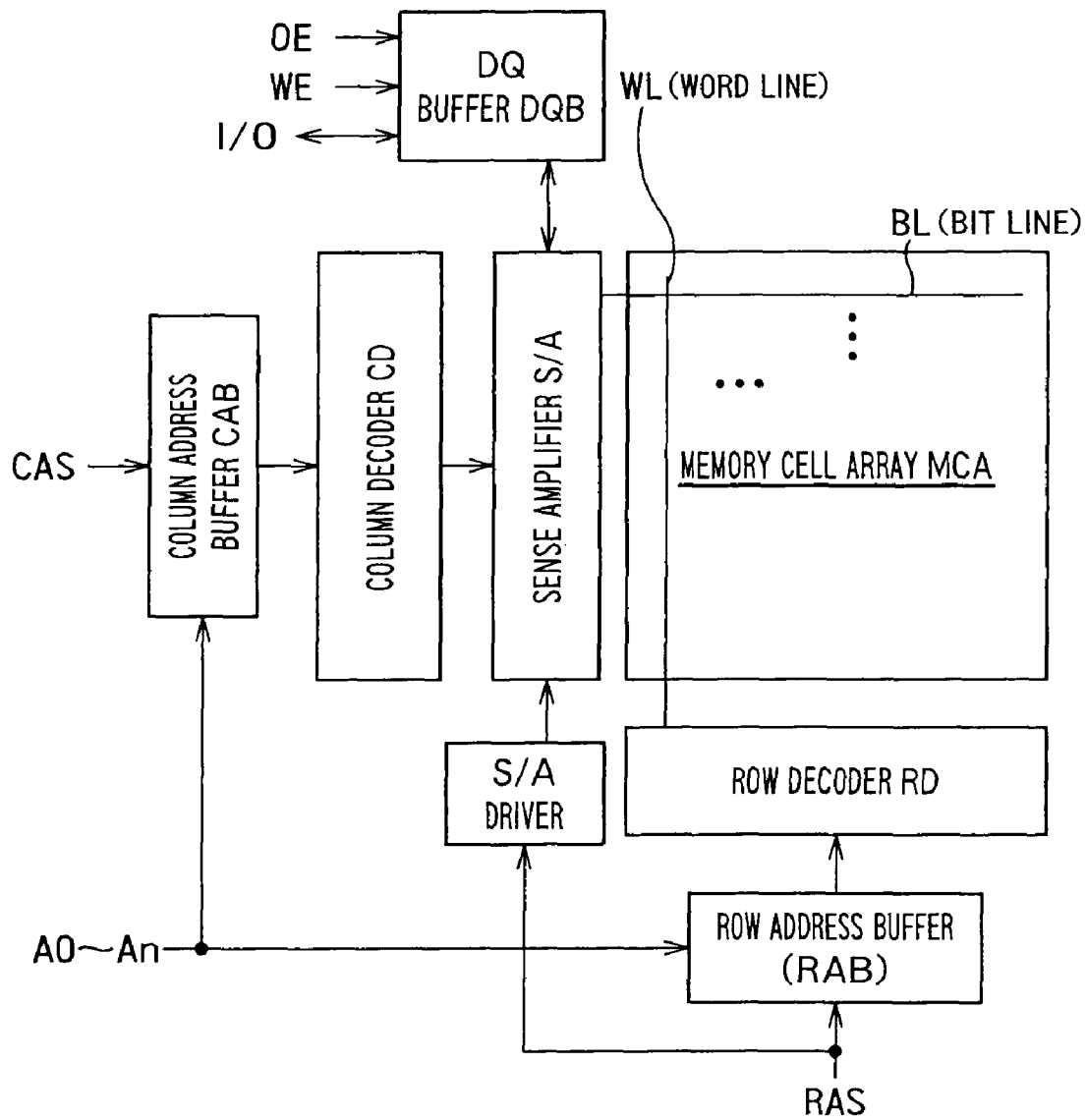
FIG. 1 is a block diagram showing a configuration of an FBC memory according to a first embodiment of the present invention.

FIG. 1 is a block diagram showing a configuration of an FBC memory according to a first embodiment of the present invention. The FBC memory includes a memory cell array MCA and sense amplifier S/As. The memory cell array MCA includes many memory cells arranged two dimensionally in a matrix shape. Word lines WLs and source lines SLs are connected to memory cells arranged in a row direction as a second direction. Bit lines BLs are connected to memory cells arranged in a column direction as a first direction orthogonal with the row direction.

The sense amplifiers S/As are connected to the bit lines BLs. The sense amplifiers S/As are configured to read data of the memory cells via the bit lines BLs, or write data into the memory cells via the bit lines BLs. Each of the sense amplifier S/A is provided corresponding to a bit line BL or a bit line pair.

A row address buffer RAB receives a row address signal RAS from the outside, temporarily stores the row address signal RAS, and outputs the signal RAS to a row decoder RD. The row decoder RD selects the word line WL corresponding to the row address signal RAS. A column address buffer CAB receives a column address signal CAS from the outside, temporarily stores this column address signal CAS, and outputs the signal CAS to a column decoder CD. The column decoder CD selects a bit line of the memory cell array MCA corresponding to the column address signal CAS.

A DQ buffer DQB is connected between the sense amplifiers S/As and an input and output unit I/O. The DQ buffer DQB temporarily stores data read from the sense amplifier S/A to output the data to the outside, or temporarily stores written data from the outside to send the data to the sense amplifier S/A. A data output from the DQ buffer DQB to the outside is controlled by an output enable signal OE. A data writing from the outside to the DQ buffer DQB is controlled by a write enable signal WE.

Figure 2:
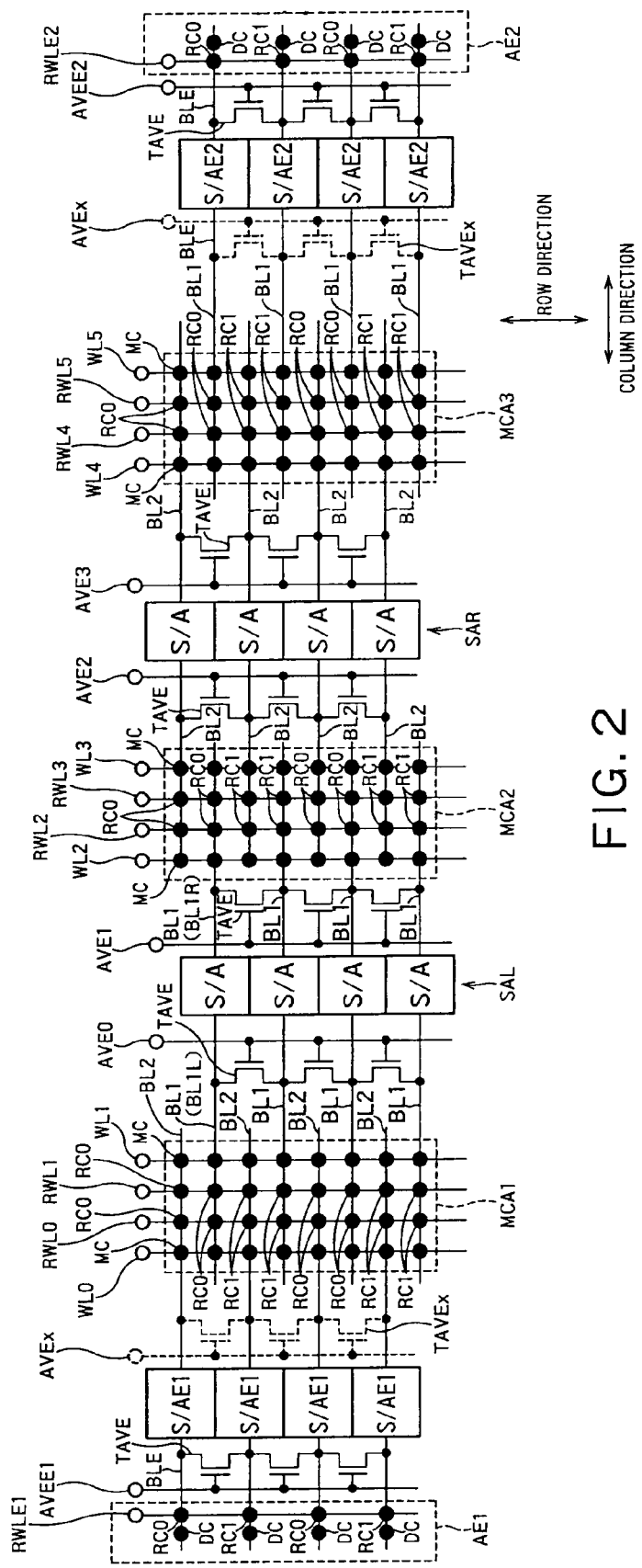
FIG. 2 shows an arrangement relationship between the memory cell arrays MCAs and the sense amplifiers S/As according to the first embodiment.

In FIG. 1, the memory cell array MCA is displayed at only one side of the sense amplifier S/A, for the sake of convenience. In practice, the memory cell arrays MCAs are arranged at both sides of the sense amplifier S/A as shown in FIG. 2. The sense amplifiers S/As are connected to two bit lines BLs provided corresponding to the memory cell arrays MCAs at both sides of the sense amplifier S/A.

FIG. 2 shows an arrangement relationship between the memory cell arrays MCAs and the sense amplifiers S/As according to the first embodiment. The memory cells MCs are arranged two dimensionally in a matrix shape, thereby constituting memory cell arrays MCA1 to MCA3 (hereinafter, also called "MCAs"). The word lines WLs are extended in a row direction, and are arranged towards a column direction as the first direction. The word lines WLs are connected to gates of the memory cells MCs. In FIG. 2, while two word lines WLs are shown at left and right sides of the sense amplifier S/A, more word lines WLs are usually provided. For example, 256 word lines WLs are provided at each of the left and right sides.

Plural first bit lines BL1s and plural second bit lines BL2s (hereinafter, also collectively called "bit lines BLs") are extended towards a column direction, and are alternately arranged towards a row direction as the second direction. The bit lines BLs are connected to sources or drains of the memory cells MCs. In the first embodiment, the bit lines BLs are connected to the drains of the memory cells MCs. In FIG. 2, while eight bit lines BLs are shown at each of the left and right sides of the sense amplifier S/A, more bit lines BLs are usually provided. For example, 1,024 bit lines are provided at each of the left and right sides of the sense amplifiers S/A. The word lines WLs and the bit lines BLs are alternately orthogonal with each other, and the memory cells MCs are provided at these intersections. These cells are called crosspoint cells.

Two reference cells RC0s and two reference cells RC1s are alternately arranged towards a row direction to which reference word lines RWLs are extended. That is, the reference cells RC0s and the reference cells RC1s are arranged in the order of RC0, RC0, RC1, RC1, RC0, RC0, RC1, RC1 onwards to a row direction. The reference cells RC0s and the reference cells RC1s are provided by the same numbers, to generate a reference current Iref. The reference word lines RWLs are extended towards a row direction, and are connected to gates of the reference cells RC0s and RC1s. One reference word line RWL is provided at each of the left and right sides of the sense amplifier S/A.

Prior to data read/write operations, the reference cells RC0S and RC1s store respectively the data "0" and the data "1" having mutually opposite polarities. Data are usually written into the reference cells RC0s and RC1s immediately after a power source is turned on. Thereafter, data are written into RC0s and RC1s again so that these reference cells keep storing the data, each time after the reference cells are activated in a data read operation of reading data to the outside of the memory, in a write operation of writing data from the outside of the memory into memory cells, and in a refresh operation. The polarities indicate a logic value "0" or "1" of data. The reference cells RC0s and RC1s are used to generate the reference current Iref at the time of detecting data of the memory cells MCs. The reference current Iref is substantially an intermediate current between a current flowing through the "0" cells and a current flowing through the "1" cells. A current load circuit (see FIG. 5) within the sense amplifier S/A passes a current to the memory cells MCs via the bit lines BLs. With this arrangement, a current corresponding to the data of the memory cell MC flows through a sense node within the sense amplifier S/A. The sense amplifier S/A can identify the logic value "1" or "0" of the data, depending on whether the current flowing through the sense node is higher or lower than the reference current Iref.

An averaging transistor TAVE is activated so that any one of averaging signal lines AVE0 to AVE3 (hereinafter, also called "AVE") generates the reference current Iref. When the averaging transistor TAVE is turned on, adjacent bit lines are short-circuited. Accordingly, data of the reference cells RC0s and data of the reference cells RC1s are averaged to generate the reference current Iref.

In the first embodiment, the memory cell arrays MCA1 to MCA3 are arranged in a column direction, and the sense amplifier S/A is provided in an interval between the adjacent memory cell arrays. The sense amplifier S/A as a first sense amplifier is connected to the first bit line BL1 of the two memory cell arrays MCAs at both sides of the sense amplifier S/A. The sense amplifier S/A as a second sense amplifier is connected to the second bit line BL2 of the two memory cell arrays MCAs at both sides of the sense amplifier S/A.

The memory according to the first embodiment employs a one-cell/bit mode. The first sense amplifier S/A detects information data transmitted to the other first bit line BL1, using the data of one first bit line BL1 as reference data. Alternatively, the first sense amplifier S/A can also detect information of one first bit line BL1, using the data transmitted to the other first bit line BL1 as reference data. In this case, the reference current Iref flows to one first bit line BL1. The second sense amplifier S/A detects information data transmitted to the other second bit line BL2, using the data of one second bit line BL2 as reference data. Alternatively, the second sense amplifier S/A can also detect information of one second bit line BL2, using the data transmitted to the other second bit line BL2 as reference data. In this case, the reference current Iref flows to one second bit line BL2.

The first and second sense amplifiers S/As are alternately provided in plural intervals of the arrangement of the memory cell arrays MCAs. For example, one first sense amplifier S/A is provided in a first interval between certain two memory cell arrays MCAs, and one second sense amplifier S/A is provided in a second interval adjacent to the first interval.

One sense amplifier S/A is provided at each of both sides of the memory cell array MCA, respectively and these sense amplifiers S/As are alternately connected to the bit lines BLs. For example, when attention is paid to the memory cell array MCA2 shown in FIG. 2, the first bit lines BL1s arranged alternately are connected to the first sense amplifiers S/As arranged at the right side of the memory cell array MCA2. The second bit lines BL2s arranged alternately between the first bit lines BL1s are connected to the second sense amplifiers S/As arranged at the left side of the memory cell array MCA2. That is, the bit lines BLs arranged in a row direction within a certain memory cell array MCA are alternately connected to the sense amplifiers S/As arranged at the left and right sides of this memory cell array MCA. This connection relationship between the sense amplifiers S/As and the bit lines BLs is the same as that for the memory cell arrays MCA1 and MCA3, respectively.

Further, in the first embodiment, edge arrays AE1 and AE2 are provided at both ends of the arrangement of the memory cell arrays MC1 to MC3. The edge arrays AE1 and AE2 are provided to generate only reference data, respectively. The reference data generated in the edge arrays AE1 and AE2 are used to detect information data from the memory cell arrays MCA1 and MCA3, respectively.

The edge arrays AE1 and AE2 include the reference cells RC0s and RC1s in a similar manner to that of the other memory cell arrays MCA1 to MCA3, but do not include the normal memory cells MCs. The reference cells RC0s and RC1s are connected to edge bit lines BLEs and edge reference word lines RWLE1 and RWLE2. The edge reference word lines RWLE1 and RWLE2 are extended towards a row direction, and one edge reference word line RWLE1 is provided in the edge array AE1, and one edge reference word line RWLE2 is provided in the edge array AE2. The edge bit lines BLEs are extended towards a column direction, and are arranged in a row direction. The edge bit lines BLEs are connected to sources or drains of the reference cells RC1s or RC0s. In the first embodiment, the edge bit lines BLEs are connected to the drains of the reference cells RC1s or RC0s.

In FIG. 2, four edge bit lines BLEs are shown at each side of edge sense amplifiers S/AE1 and S/AE2 (hereinafter, also collectively called "edge sense amplifiers S/AEs"), respectively. However, more edge bit lines BLEs are usually provided. For example, 512 edge bit lines BLEs are provided at each side of the edge sense amplifiers S/AE1 and S/AE2, respectively. The edge reference word lines RWLE1 and RWLE2 and the edge bit lines BLEs are orthogonal with each other, and the reference cells RC0s or RC1s are provided at these intersections.

The edge sense amplifiers S/AEs are provided between the arrangement of the memory cell arrays MCA1 to MCA3 and the edge array AE1 or AE2. The edge sense amplifiers S/AEs have a configuration identical to that of the sense amplifiers S/As, and the basic operation of the edge sense amplifiers S/AEs is also identical to that of the sense amplifiers S/As. However, data that the edge sense amplifiers S/AEs receive from the edge array AE1 or AE2 are necessarily reference data, and data that the edge sense amplifiers S/AEs receive from the memory cell array MCA1 or MCA3 are necessarily data to be detected. That is, the edge sense amplifiers S/AEs detect data from the memory cell array MCA1 or MCA3 at one end of the arrangement of the memory cell arrays MCA1 to MCA3, based on the reference data from the edge array AE1 or AE2. Therefore, the averaging transistor TAVE and an averaging signal line AVEE1 are provided between the edge sense amplifier S/AE1 and the edge array AE1. An averaging transistor TAVEx and an averaging signal line AVEx are provided between the edge sense amplifier S/AE1 and the memory cell array MCA1, for symmetric property and regularity of the arrangement. The averaging transistor TAVE and an averaging signal line AVEE2 are provided between the edge sense amplifier S/AE2 and the edge array AE2. The averaging transistor TAVEx and the averaging signal line AVEx are provided between the edge sense amplifier S/AE2 and the memory cell array MCA3, for symmetric property and regularity of the arrangement.

Because the averaging transistor TAVEx and the averaging signal line AVEx are provided for symmetric property and regularity of the arrangement, they are not actually driven. The averaging signal line AVEx is fixed to a ground potential. The averaging transistor TAVEx and the averaging signal line AVEx can be omitted.

The edge arrays AE1 and AE2 include dummy cells DCs in addition to the reference cells RC0s and RC1s. The dummy cells DCs are cells provided as dummy, so that the reference cells RC0s and RC1s are formed in a three-dimensional structure on substantially the same plane as that of the memory cells MCs to be read. That is, the dummy cells DCs are only necessary for manufacturing the reference cells RC0s and RC1s, and are not relevant to the actual operation. The edge dummy cells DCs can have the same configuration as that of the normal memory cells MCs.

Memory cells MCs of the same number as that of the word lines WLs are connected to one bit line BL1 and one bit line BL2, respectively. That is, a few hundred to a few thousand cells are connected to one bit line BL1 and one bit line BL2, respectively. Therefore, the bit lines BL1s and BL2s require a certain level of length. However, only the reference cells RC0s or RC1s and the dummy cells DCs are connected to one edge bit line BLE. That is, a few to a few dozens of cells at most are connected to one edge bit line BLE. Therefore, the edge bit lines BLEs provided in the edge arrays AE1 and AE2 can be shorter than the bit lines BL1s and BL2s provided in the memory cell arrays MCA1 to MCA3. As a result, the edge arrays AE1 and AE2 can be formed in a much smaller region (area) than that of the memory cell arrays MCA1 to MCA3.

Figure 3:
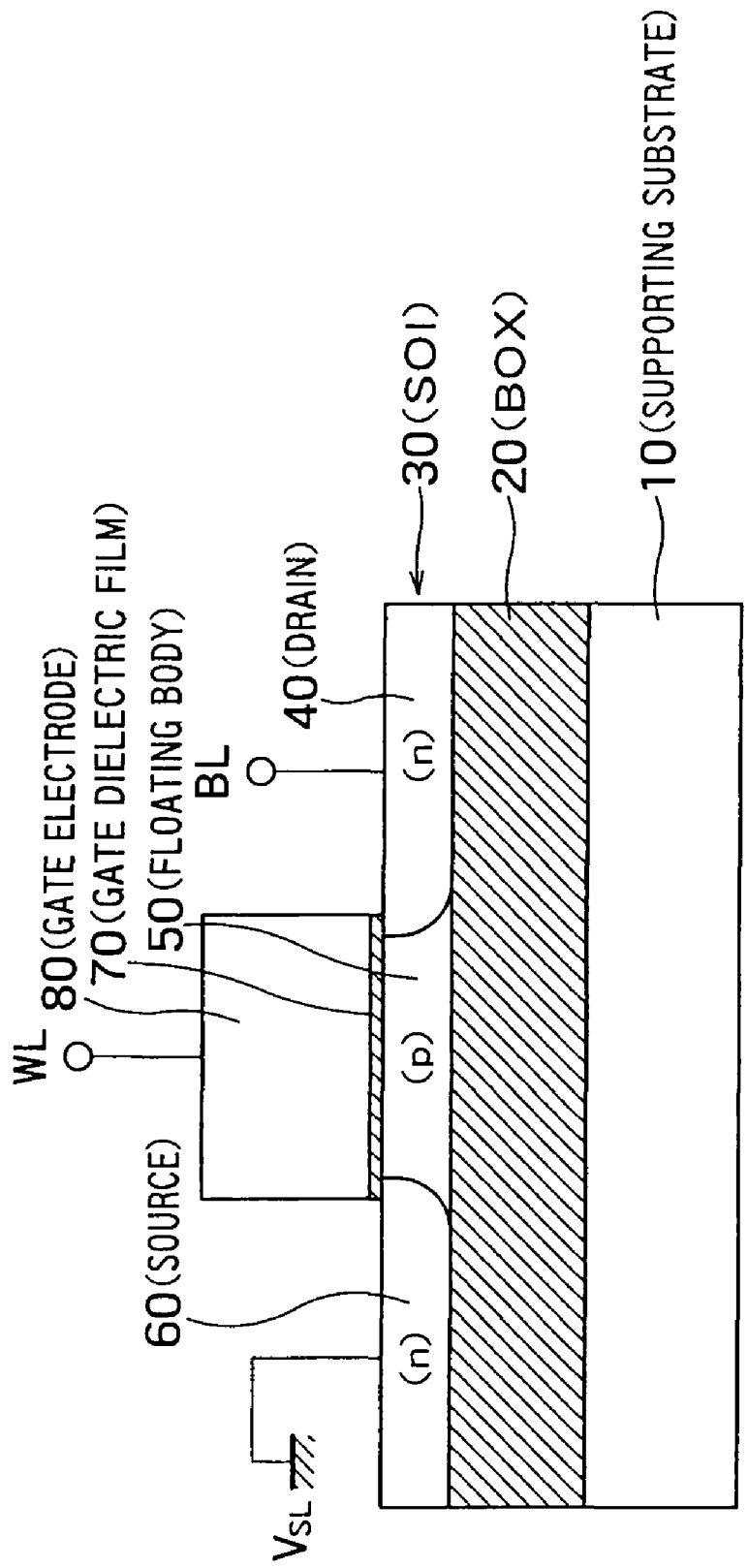
FIG. 3 is a cross-sectional diagram showing a configuration of the memory cell MC.

FIG. 3 is a cross-sectional diagram showing a configuration of the memory cell MC. The reference cells RC0 and RC1 and the dummy cell DC have structures identical to that of the memory cell MC. The memory cell MC is provided on an SOI substrate including a supporting substrate 10, a BOX layer 20, and an SOI layer 30. A source 60 and a drain 40 are provided in the SOI layer 30. A floating body 50 (hereinafter, "body 50") is formed in the SOI layer 30 between the source 60 and the drain 40. The body 50 is a semiconductor having an opposite conductivity to those of the source 60 and the drain 40. In the first embodiment, the memory cells MCs are an N-FET. The body 50 is in an electrically floating state by having a part or whole of the body 50 encircled by the source 60, the drain 40, the BOX layer 20, a gate dielectric film 70, and an STI (Shallow Trench Isolation) (not shown). An FBC memory can store logic data (binary data) based on the number of majority carriers within the body 50.

One example of a method of writing data into the memory cells MCs is explained below. To write the data "1" into the memory cells MCs, the memory cells MCs are operated in a saturated state. For example, the word lines WLs are biased at 1.5 V, and the bit lines BLs are biased at 1.5 V. The source is at a ground GND (0V). With this arrangement, an impact ionization occurs near the drain, and a large amount of electron hole pairs are generated. Electrons generated by the impact ionization flow to the drain, and the holes are accumulated in the body having a low potential. When a current flowing at the occurrence of the holes in the impact ionization is balanced with a forward current at a pn junction between the body and the source, a body voltage reaches an equilibrium state. This body voltage is about 0.7 V.

To write the data "0", the bit lines BLs are decreased to a negative voltage. For example, the potential of the bit lines BLs is decreased to −1.5 V. Based on this operation, a pn junction between the body 50 and the drain 40 is biased to a forward direction to a large extent. Holes accumulated in the body 50 are discharged to the drain 40, and the data "0" is stored in the memory cells MCs.

One example of a method of reading data from the memory cells MCs is explained below. In the data read operation, the word lines WLs are activated in a similar manner to that at the data writing time. However, the bit lines BLs are set lower than those at the time of writing the data "1". For example, the word lines WLs are set at 1.5 V, and the bit lines BLs are set at 0.2 V. The memory cells MCs are operated in a linear region. The memory cells MCs storing the data "0" and the memory cells MCs storing the data "1" are different in threshold voltages of the memory cells MCs, depending on a difference between numbers of holes accumulated in the body 50. The data "1" and the data "0", are identified by detecting this difference between the threshold voltages. The bit lines BLs are set to a low voltage during a reading time for the following reason. When the voltage of the bit lines BLs is set high to bias the memory cells MCs to a saturated state, there is a risk that the data "0" is changed to the data "1" due to impact ionization at the time of reading the data "0".

Figure 4:
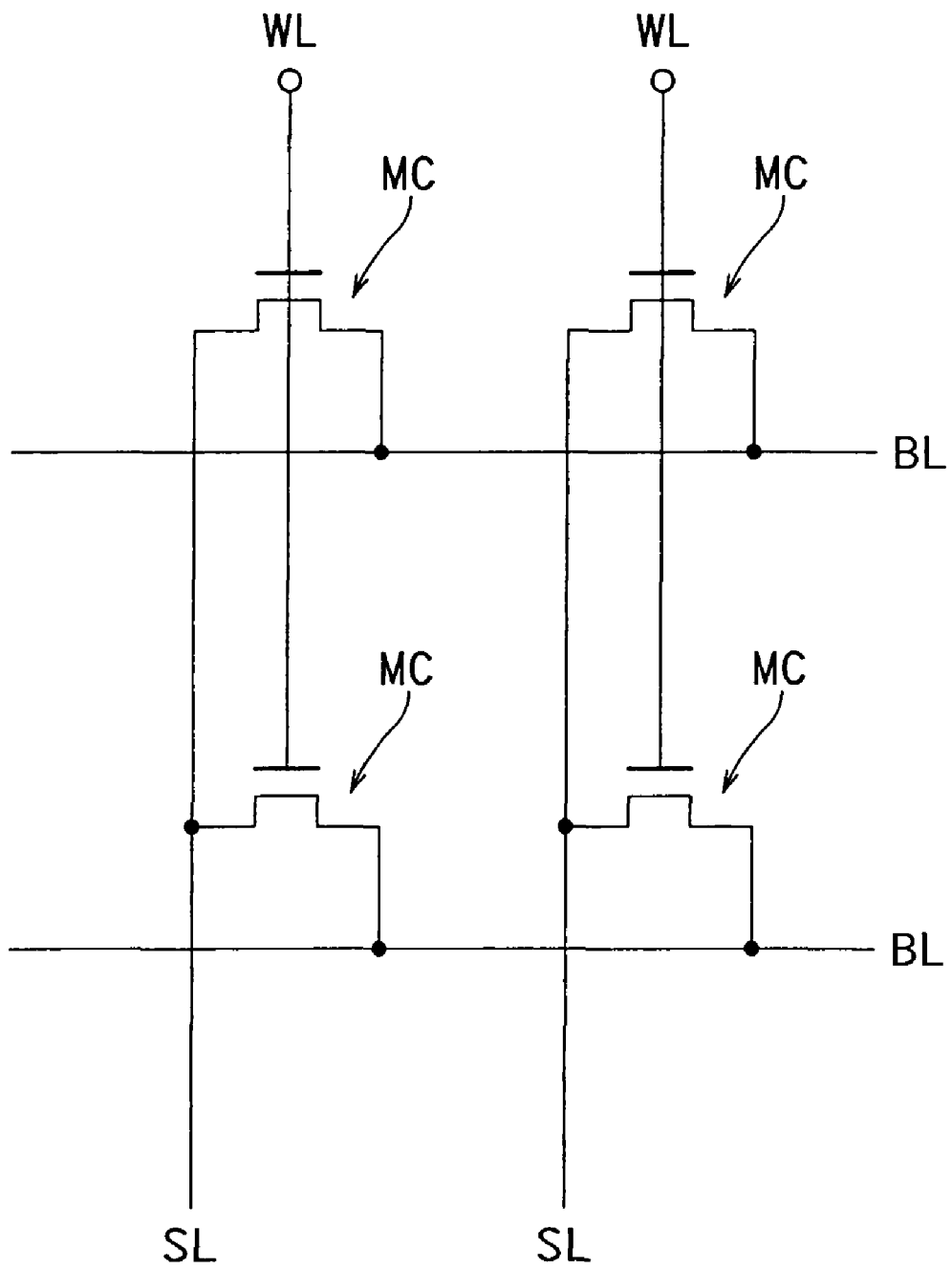
FIG. 4 is a circuit diagram showing a connection relationship between the memory cells MCs, the bit lines BLs, the word lines WLs, and the source lines SLs.

FIG. 4 is a circuit diagram showing a connection relationship between the memory cells MCs, the bit lines BLs, the word lines WLs, and the source lines SLs. A gate of each of the memory cell MC is connected to the word line WL. One of a drain and a source of the memory cell MC is connected to the bit line BL, and the other is connected to the source line SL.

Figure 5:
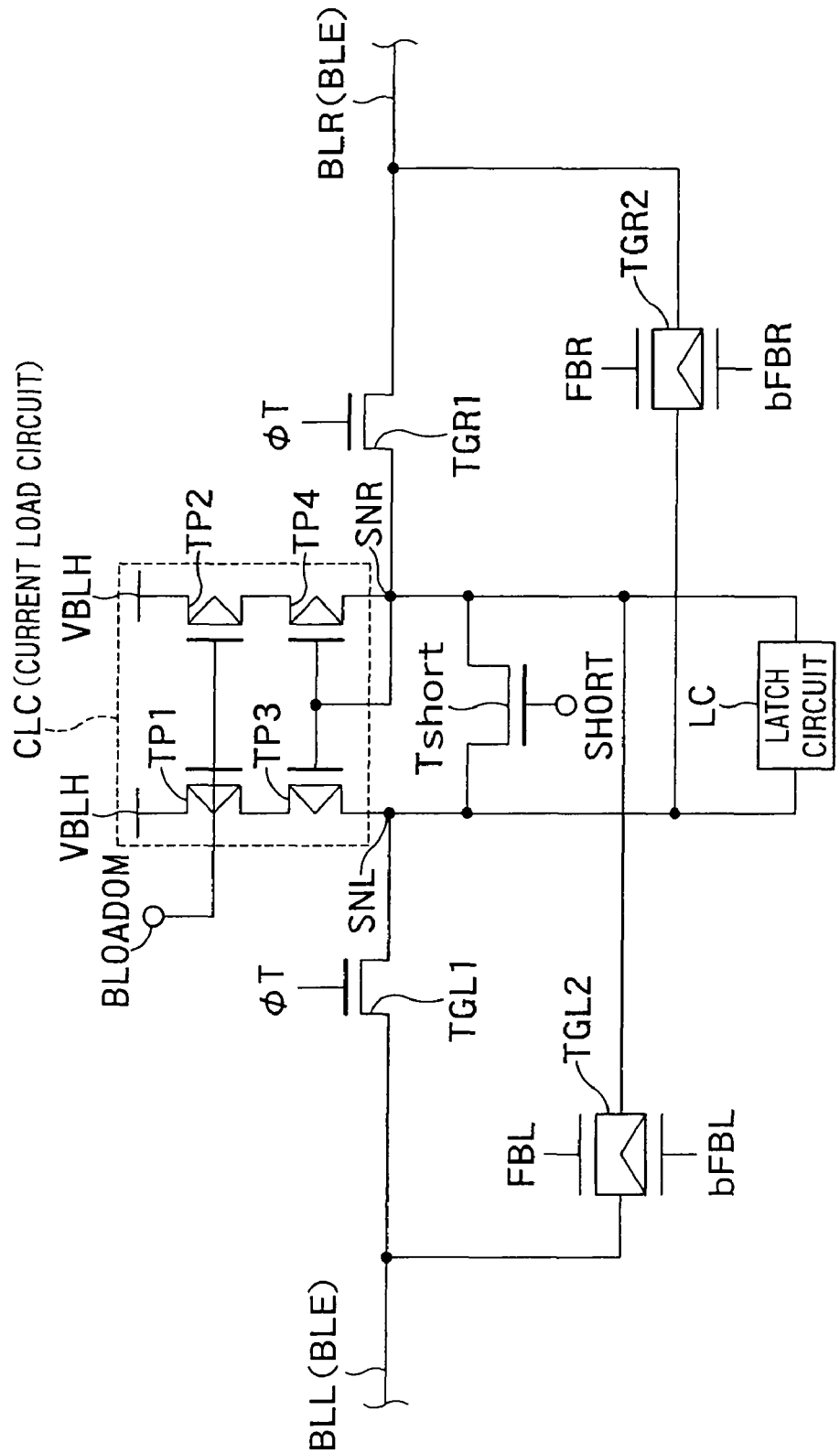
FIG. 5 is a circuit diagram showing one example of a configuration of the sense amplifier S/A.

FIG. 5 is a circuit diagram showing one example of a configuration of the sense amplifier S/A. Each of the edge sense amplifiers S/AE1 and S/AE2 has a configuration identical to that of the sense amplifier S/A.

In the first embodiment, an open-bit line configuration is employed. Therefore, the sense amplifiers S/As are connected to bit lines BLL and BLR provided at left and right sides of the sense amplifier S/A, respectively. The bit lines BLL and BLR are the first bit lines BL1s or the second bit lines BL2s. In the edge sense amplifiers S/AE1 and S/AE2, one of the bit lines BLL and BLR is the edge bit line BLE.

The sense amplifier S/A passes a current to two bit lines connect to both sides of the sense amplifier S/A, and detects data based on a potential difference generated between the two bit lines. Each of the sense amplifiers S/AE1 and S/AE2 also passes a current to the two bit lines connected to both sides of the sense amplifier, and detects data based on a potential difference generated between the two bit lines. That is, the sense amplifiers and the edge sense amplifiers in the first embodiment employ a current sense-amplifier system that passes a current to the FBC and detects a signal difference (a potential difference) of data.

The sense amplifier S/A includes a pair of sense nodes SNL and SNR. The sense node SNL is connected to a left-side bit line BLL via a transfer gate TGL1, and is connected to a right-side bit line BLR via a transfer gate TGR2. The sense node SNR is connected to the bit line BLL via a transfer gate TGL2, and is connected to the bit line BLR via a transfer gate TGR1.

The transfer gates TGL1 and TGR1 are on/off controlled by a signal ΦT. The transfer gate TGL2 is on/off controlled by signals FBL and bFBL. The transfer gate TGR2 is on/off controlled by signals FBR and bFBR. A signal b** is used as a name of a signal to activate the transfer gates and others at a low level potential.

In the data read operation, for example, the sense amplifier S/A reads data of the memory cells MCs, and outputs the data to the outside via a DQ buffer (not shown), and also writes back this data to the memory cells MCs. When the data is read from the "1" cells connected to the bit lines BLLs, the transfer gates TGL1 and TGR1 become the on state, and the transfer gates TGL2 and TGR2 become the off state. Because the threshold voltages of the "1" cells are relatively low, the amount of the current flowing from the sense node SNL to the "1" cells becomes larger than that of Iref. Because the current flowing from the sense node SNR to the bit line BLR is Iref, the potential of the sense node SNL becomes lower than the potential of the sense node SNR. A latch circuit LC amplifies a difference between a potential of the sense node SNL and a potential of the sense node SNR, and latches this data to the sense nodes SNL and SNR. The latch circuit LC included in the sense amplifier S/A can be a cross-couple type dynamic latch circuit. On the other hand, to write back the data "1" to the memory cells MCs, a high potential needs to be given to the bit lines BLLs. For this purpose, the transfer gate TGL1 is set to off, and the transfer gate TGL2 is set to on, thereby connecting the sense node SNR at a high potential to the bit lines BLLs.

The sense amplifier S/A further includes a current-mirror type current load circuit (hereinafter, "load circuit") CLC including P-type transistors TP1 to TP4. The transistors TP1 and TP2 are controlled by a signal BLOADON, and work as a switching element that starts or ends a current load to the memory cells MCs. The transistors TP3 and TP4 control a current so that the current based on the reference data flows to the memory cells MCs. VBLH denotes a high potential given to the bit lines BLs at the time of writing the data "1" to the memory cells MCs. The load circuit CLC is not limited to this mirror circuit. For example, the latch circuit LC can have an additional function as a current load circuit. In this case, the load circuit CLC is not necessary. In the first embodiment, while the load circuit CLC includes a p-FET, the load circuit CLC can be configured by an n-FET or a linear resistance element. In this case, the load circuit CLC operates receiving LOADON as an inverted signal in place of bLOADON.

The sense amplifier S/A further includes a transistor Tshort as a short-circuit switch connected between the sense nodes SNR and SNL. The transistor Tshort is provided to set the potential of the sense node SNL and the potential of the sense node SNR equal during a precharge period before the operation of reading data to the outside of the memory, the operation of writing data from the outside of the memory into the memory, and a refresh operation (hereinafter, also called "normal operation"). Therefore, in the normal operation, the transistor Tshort is in the off state. However, the transistor Tshort is also held in the on state until a certain point in time of the normal operation, like in a second embodiment of the present invention.

Figure 6A:
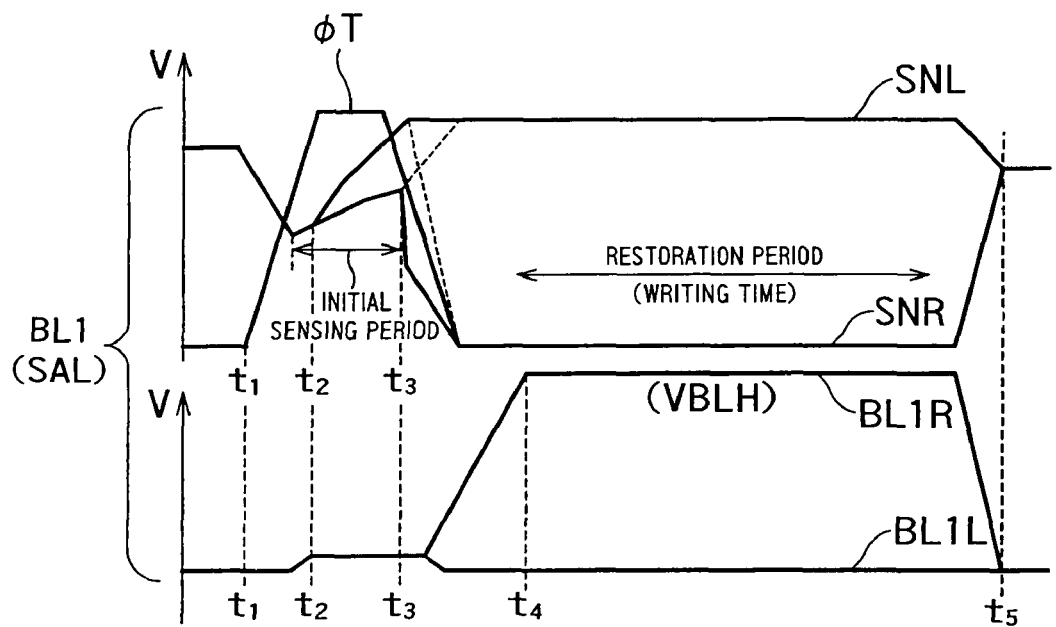
FIG. 6A and FIG. 6B are schematic timing diagrams showing one example of a data read operation of the FBC memory according to the first embodiment.
Figure 6B:
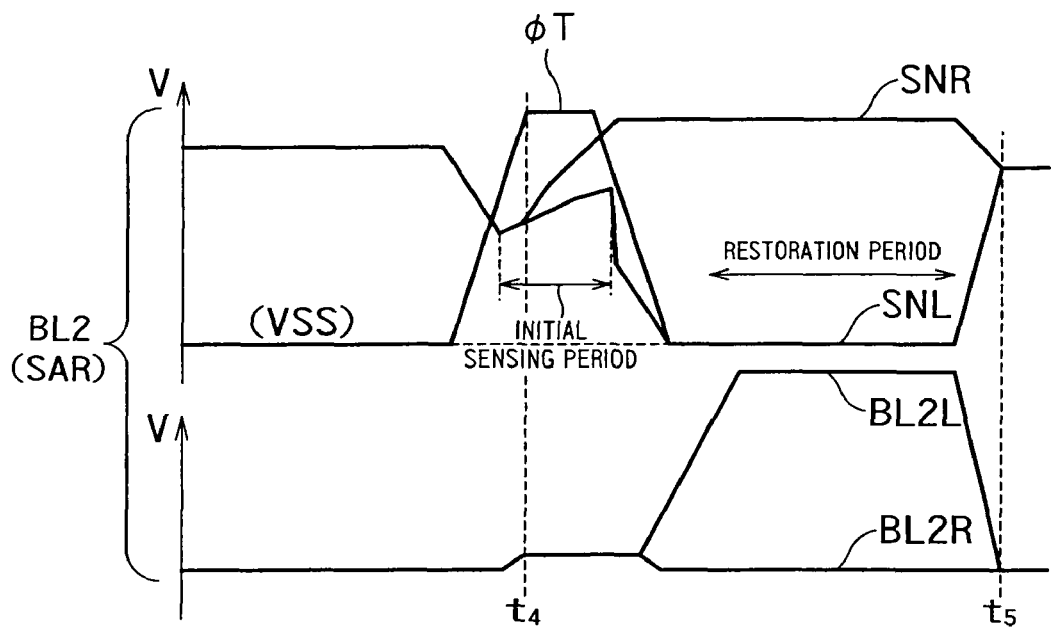

FIG. 6A and FIG. 6B are schematic timing diagrams showing one example of a data read operation of the FBC memory according to the first embodiment. This read operation can be applied to the operation of reading data to the outside of the memory, the operation of writing data from the outside of the memory into the memory, and the refresh operation.

In the operation of writing data from the outside into the memory, the sense amplifier S/A once reads data of the memory cells MCs, updates the data latched to the sense amplifier S/A with data to be written, and writes back the updated data to the memory cells MCs.

The refresh operation is an operation of once reading data from the memory cells MCs, latching this data to the sense amplifier S/A, and writing back logic data which is the same as this data to the same memory cells. The refresh operation is performed to prevent unselected "1" cells connected to activated word lines WLs from being changed to the "0" cells by a charge pumping phenomenon. The charge pumping phenomenon is a phenomenon that positive holes within the body disappear from the body as a result of recoupling of the positive holes in the body with electrons trapped by a surface state present in interfaces of a silicon substrate and a gate dielectric film.

"Activation" means to turn on or drive elements or circuits, and "inactivation" means to turn off or stop elements or circuits. Therefore, it should be noted that HIGH (high potential level) signals can be activation signals, and LOW (low potential level) signals can be activation signals. For example, an NMOS transistor is activated by setting its gate to HIGH. On the other hand, a PMOS transistor is activated by setting its gate to LOW.

In the first embodiment, data is first read from a sense amplifier column SAL as shown in FIG. 6A, and then, data is read from a sense amplifier column SAR as shown in FIG. 6B. In the following read operation, information data of the memory cells MCs within the memory cell array MCA2 shown in FIG. 2 is read out. FIG. 6A shows the operation of memory cells from which data is to be read or to which data is to be written. Broken lines in FIG. 6A show the operation of writing data by inverting the data in the write operation.

First, the sense amplifier column SAL shown in FIG. 2 is activated (t1). More specifically, the signal ΦT shown in FIG. 5 is activated to a high level, and the transfer gates TGL1 and TGR2 are turned on. Further, the load circuit CLC is activated. At the same time, the averaging signal line AVE0 and the reference word line RWL1 shown in FIG. 2 are activated. As a result, the reference current Iref flows to a first bit line BL1L at the left side of the sense amplifier column SAL. On the other hand, the word lines WL2s in FIG. 2 are activated. As a result, information data is propagated to a first bit line BL1R at the right side of the sense amplifier column SAL. At this time, as shown by t2 in FIG. 6A, a signal difference occurs between the sense node SNL and the sense node SNR based on the polarities of the information data. In FIG. 6A, the memory cells connected to the first bit line BL1R are the "1" cells.

At t3, when the difference between signals between the sense node SNL and the sense node SNR is sufficiently developed, the sense amplifier S/A drives the latch circuit LC shown in FIG. 5. As a result, the latch circuit LC amplifies the difference between signals between the sense node SNL and the sense node SNR, and latches the data. As explained above, at t1 to t3, the sense amplifier S/A within the sense amplifier column SAL detects information data via the first bit line BL1R in the memory cell array MCA2 shown in FIG. 2.

In a data reading period from t1 to t3 (initial sensing period), the sense amplifier column SAR shown in FIG. 6B has voltages of the second bit lines BL2s fixed to a potential VBLL. The potential VBLL is a bit line potential at the time of writing the data "0", and is equal to a source line potential VSL (for example, a ground potential). In the memory cell array MCA2 shown in FIG. 2, during a reading period that the first bit line BL1R is transmitting information data, voltages of the second bit lines BL2s adjacent to a row direction of the first bit line BL1 are fixed. That is, the bit lines BLs are driven alternately (intermittently), and voltages of other bit lines not driven are fixed. Further, voltages of the bit lines BLs are fixed alternately (intermittently), and other bit lines are driven. Therefore, during the data reading, information data transmitted to the first bit lines BL1s are not affected by a capacitance coupling between the first bit lines BL1s and the second bit lines BL2s. That is, during the data reading, the information data transmitted to the first bit lines BL1s is not affected by noise from the second bit lines BL2s. The second bit lines BL2s work as a shield. Therefore, the information data transmitted to the first bit lines BL1s is not affected by other first bit lines BL1s. As a result, the FBC memory according to the first embodiment can accurately detect information data to be read, without being influenced by adjacent bit lines.

In FIG. 6A, data is often written by being inverted as shown by broken lines. Particularly, it takes time to write the data "1" into the "0" cells. Therefore, in the write operation, a relatively long time is necessary to write data into the memory cells in which the data is to be written. On the other hand, as shown in FIG. 6B, data is only restored into the memory cells connected to the second bit lines BL2s into which data is not to be written. Because data is not written inversely, substantially a few positive holes lost in a charge pumping phenomenon are replenished. Therefore, as compared with the writing time shown in FIG. 6A, the time of restoring the data into the memory cells connected to the second bit lines BL2s can be shorter. That is, the read operation of reading data from the memory cells connected to the second bit lines BL2s is started with a delay from the starting of the read operation of reading data from the memory cells connected to the first bit lines BL1s. However, the write operation of writing data into the memory cells connected to the second bit lines BL2s can be finished at the same time (t5) as that of the write operation of writing data into the memory cells connected to the first bit lines BL1s. As a result, in the first embodiment, a cycle time is not substantially long in the write operation of writing data from the outside.

Next, at time t4 and after, the sense amplifier column SAL performs a restore operation (a refresh operation) of writing back the read data to the memory cells MCs. In this case, feedback lines FBR and bFBR shown in FIG. 5 are activated, and the transfer gate TGR2 becomes the on state. Accordingly, the sense node SNL latching a high potential level is connected to the first bit line BL1R. As a result, the data "1" is written back to the memory cells MCs connected to the first bit line BL1R.

While the memory cells MCs arranged at the intersections between the activated word lines WL2s and the second bit lines BL2s are unselected memory cells, these memory cells MCs are influenced by the above charge pumping phenomenon. Therefore, as shown in FIG. 6B, the sense amplifier column SAR performs the refresh operation to the memory cells MCs arranged at the intersections between the word lines WL2s and the second bit lines BL2s. In the refresh operation, the sense amplifier column SAR once reads the data, and writes back this data to the memory cells MCs, in a similar manner to that of the sense amplifier column SAL shown in FIG. 6A. In this case, the first bit line BL1R is in the period of the restore operation, and the first bit line BL1R is fixed to the bit line potential during the restore operation. In the first embodiment, at this time, the first bit line BL1R is in the state of being fixed to the high level potential (VBLH) for writing the data "1". That is, at the time of driving the second bit lines BL2s, the bit lines BLs are alternately (Intermittently) driven, and the voltages of other nondriven bit lines BL1s are fixed. That is, the voltages of the bit lines BLs are fixed alternately (Intermittently), and other bit lines BL2s are driven. Therefore, in the refresh operation of the memory cells MCs connected to the second bit lines BL2s, information data transmitted to the second bit lines BL2s are not affected by noise from the first bit line BL1R. Because the first bit line BL1R works as a shield, information data transmitted to the second bit lines BL2s are not affected by other bit lines BL2s. As a result, the FBC memory according to the first embodiment does not detect data by error during the refresh operation.

When potentials of the first bit lines BL1s or potentials of the second bit lines BL2s are fixed, values of the fixed potentials can be optional. Therefore, values of the fixed potentials can be potentials other than VBLL, VBLH, and VSL.

As is clear from FIGS. 6A and 6B, an initial sensing period of the first bit lines BL1s is deviated from an initial sensing period of the second bit lines BL2s. Therefore, a total cycle time is longer by substantially the initial sensing period. However, because the refresh of the second bit lines BL2s is performed within the restoration period of the first bit lines BL1s, a period (initial sensing period) of detecting data is usually is much shorter than a period (restoration period) of writing back the data. Accordingly, an increase of the cycle time is substantially negligible. The initial sensing period can be said as a period of developing a potential difference of data in a sense node pair SNL and SNR.

In the conventional 1T-1C DRAM or the conventional ferroelectric memory, the initial sensing becomes floating in a state that all bit lines are connected to the memory cells. If the potentials of the bit lines are alternately fixed at random such as a certain bit line is at the potential of the "1" writing and other bit line is at the potential of the "0" writing, data of the memory cells connected to these bit lines are destroyed. On the other hand, when the potentials of the bit lines are left floating, the bit lines are affected by a capacitance coupling with adjacent bit lines, and accurate data detection cannot be performed. Therefore, the unit according to the first embodiment cannot be applied to the conventional 1T-1C DRAM or the conventional ferroelectric memory.

As shown in FIGS. 6A and 6B, to deviate the initial sensing period of the first bit lines BL1s from the initial sensing period of the second bit lines BL2s, an address for selecting any one of the first bit lines BL1s and the second bit lines BL2s is necessary. The address for selecting any one of the first bit lines BL1s and the second bit lines BL2s is hereinafter called "LR identification address".

Conventionally, one row address is allocated to one word line WL. However, in the first embodiment, even when the same word line WL is selected, the initial sensing period of the first bit lines BL1s and the initial sensing period of the second bit lines BL2s need to be deviated. Therefore, the first bit lines BL1s and the second bit lines BL2s are identified by the LR identification address.

This LR identification address is added to a row address for selecting the word line WL. For example, one bit is added to the lowest order of a row address, and this additional bit is used as the LR identification address. For example, when the LR identification address is "0", the sense amplifier column SAL, that is, the first bit line BL1, is selected. When the LR identification address is "1", the sense amplifier column SAR, that is, the second bit line BL2, is selected.

A row address is activated earlier than a column address. Therefore, a sense amplifier column including data to be read can be activated much earlier. Therefore, in the first embodiment, the access time is not delayed.

The operation of the edge sense amplifiers S/AE1 and S/AE2 is explained next.

Figure 7:
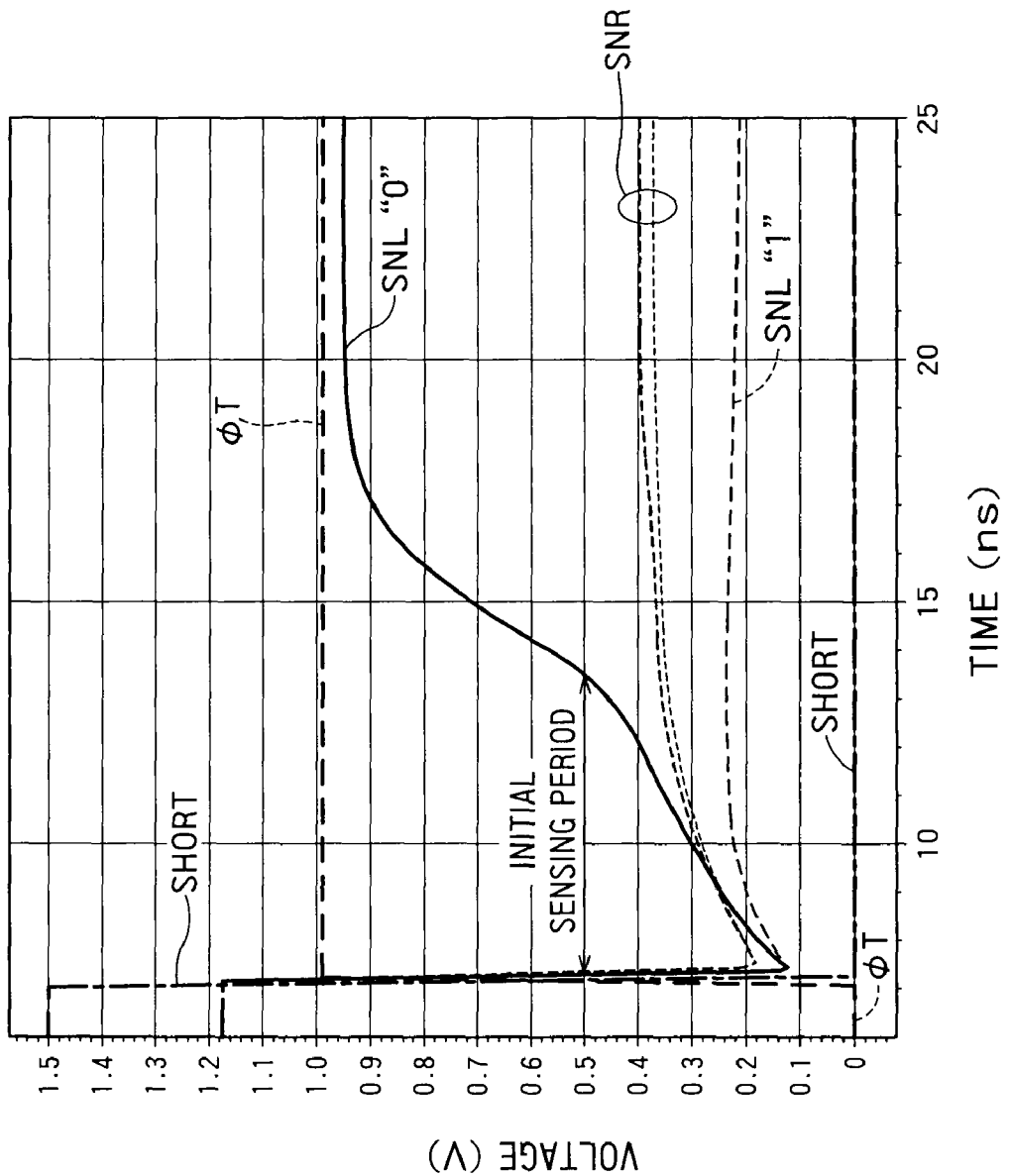
FIG. 7 shows a result of a simulation showing a read operation of the sense amplifier S/A.
Figure 8:
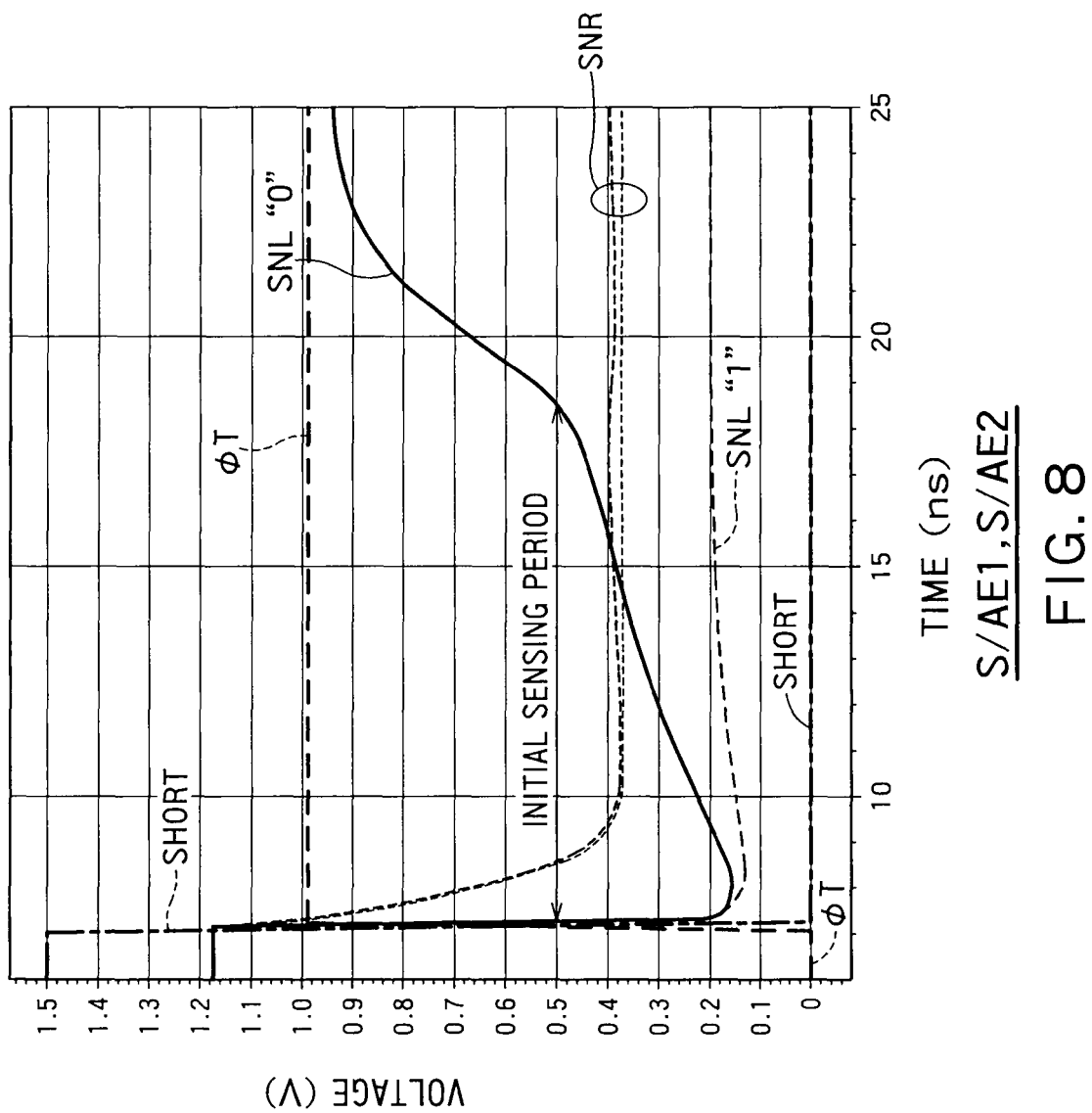
FIG. 8 shows a result of a simulation showing read operations of the edge sense amplifiers S/AE1 and S/AE2.

FIG. 7 shows a result of a simulation showing a read operation of the sense amplifier S/A. FIG. 8 shows a result of a simulation showing read operations of the edge sense amplifiers S/AE1 and S/AE2. For the sake of comparison, FIG. 7 shows the read operation of the sense amplifier. FIGS. 6A and 6B schematically show simulation results of FIG. 7, and show substantially the same content as that of FIG. 7. In FIG. 7 and FIG. 8, SNL "0" shows a potential of the sense node SNL propagating the data "0", and SNL "1" shows a potential of the sense node SNL propagating the data "1".

As shown in FIGS. 7 and 8, the signal $\Phi T$ is activated at time of about 7 ns, and the transfer gates TGL1 and TGR1 become the on state. Substantially at the same time, a signal SHORT is inactivated, and the transistor Tshort becomes the off state. When the transistor Tshort becomes the off state, the sense nodes SNR and SNL are electrically isolated. Although not shown, at this time, the word line WL of a certain address is selected, and the load circuit CLC is activated by the signal BLOADON. As a result, as shown in FIGS. 7 and 8, a potential difference occurs between the sense nodes SNR and SNL.

For example, in FIGS. 7 and 8, it is assumed that the sense node SNR propagates the reference data, and the sense node SNL propagates the data "0" or the data "1". Because the threshold voltages of the "0" cells are higher than those of the "1" cells, a potential of the sense node SNL "0" propagating the data "0" becomes higher than a potential of the sense node SNL "1" propagating the data "1". The latch circuit LC amplifies a potential difference between the sense node SNR propagating the reference data and the sense node SNL "0" or SNL "1", and latches the potential difference. Accordingly, the sense amplifier S/A, the edge sense amplifier S/AE1 or S/AE2 can detect either the data "0" or the data "1".

In the first embodiment, the edge arrays AE1 and AE2 include only the reference cells RC1 and RC0 and a small number of dummy cells DCs necessary to manufacture the reference cells RC1 and RC0. Therefore, the areas of the edge arrays AE1 and AE2 are negligibly small as compared with the areas of the memory cell arrays MCA1 to MCA3.

In the DRAM including conventional 1T-1C, when the bit line capacitance at the read side is unbalanced with the bit line capacitance at the reference side, a sense amplifier detects data by error at the reading time. Therefore, in the DRAM including the 1T-1C, a length of the bit line at the read side needs to substantially equal to a length of the bit line at the reference side.

On the other hand, in the FBC according to the first embodiment, the load circuit CLC passes a current to the memory cells MCs during the initial sensing period, thereby causing the sense nodes SNR SNL to develop a signal difference. In the current sense amplifier system of passing a current to the memory cells MCs, even when the bit line capacitance at the read side is unbalanced with the bit line capacitance at the reference side, only the initial sensing periods are different, and the potential difference between the sense nodes SNR and SNL can be sufficiently large.

In the edge sense amplifiers S/AE1 and S/AE2 shown in FIG. 8, for example, the capacitance of the edge bit lines BLEs propagating the reference data is smaller than the capacitance of the bit line BL1 or BL2 propagating the information data. Therefore, the initial sensing period (about 12 ns) in the edge sense amplifiers S/AE1 and S/AE2 is longer than the initial sensing period (about 6 ns) of the sense amplifier S/A shown in FIG. 7. However, after a lapse of the initial sensing period, a potential difference between the sense nodes SNL and SLR in the edge sense amplifiers S/AE1 and S/AE2 is substantially equal to that in the sense amplifier S/A. Therefore, the edge sense amplifiers S/AE1 and S/AE2 can accurately detect data in a similar manner to that of the sense amplifier S/A, although the bit line capacitances at both sides are unbalanced.

The read operations shown in FIGS. 7 and 8 can be applied to the read operation of reading data to the outside of the memory, the write operation of writing data from the outside of the memory to the MCs, and the refresh operation.

In the first embodiment, at the data reading time, information data transmitted to the first bit lines BL1s are not affected by the capacitance coupling between the first bit lines BL1s and the second bit lines BL2s. Because the second bit lines BL2s work as a shield, information data transmitted to the first bit lines BL1s are not easily affected by other first bit lines BL1s. The edge sense amplifiers S/SAE1 and S/SAE2 can accurately detect data, although the bit line capacitances at both sides are unbalanced.

Second Embodiment

Figure 9:
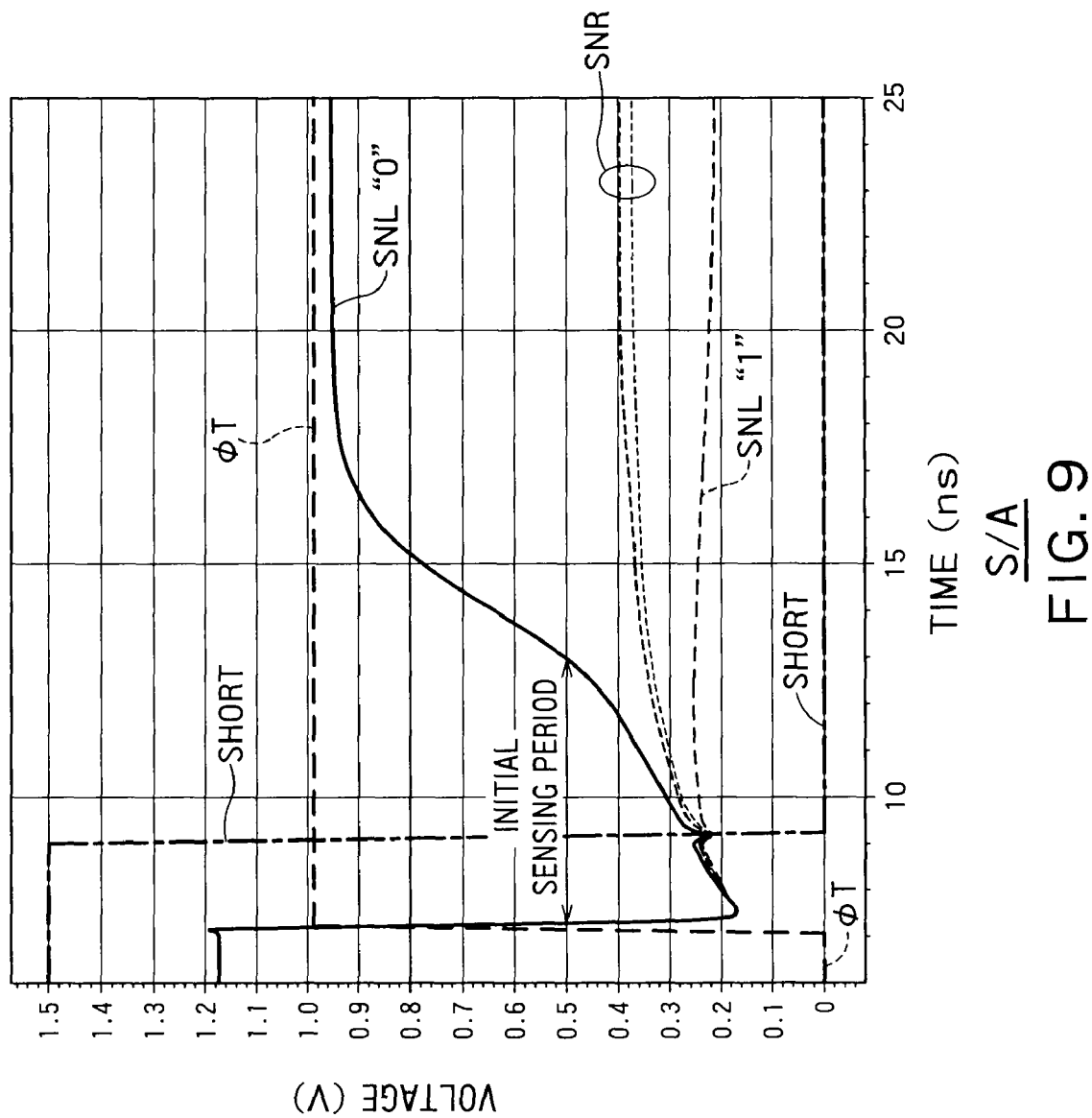
FIG. 9 and FIG. 10 show results of a simulation showing read operations of the edge sense amplifiers S/AE1 and S/AE2 according to the second embodiment of the present invention.
Figure 10:
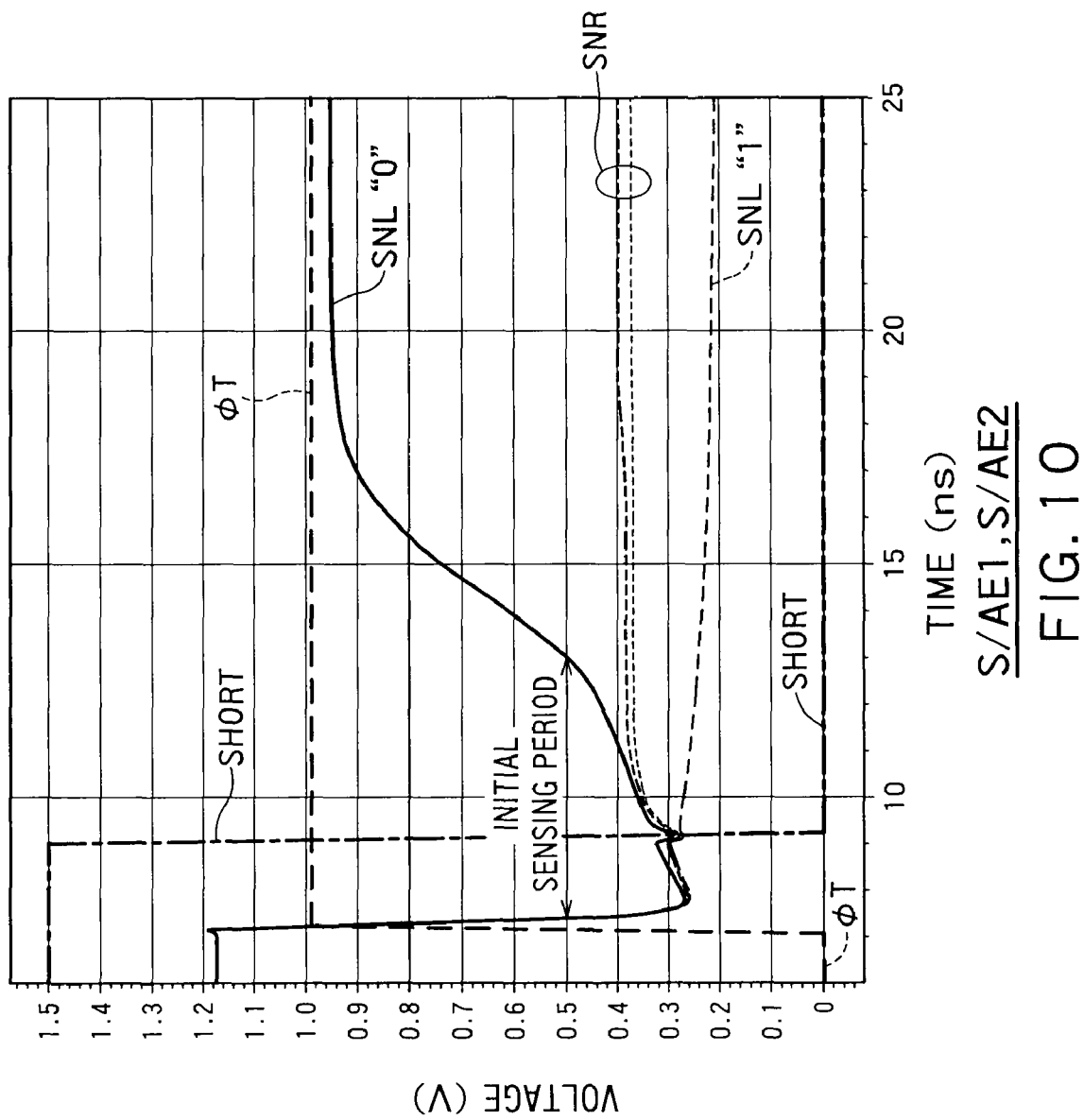

FIG. 9 and FIG. 10 show results of a simulation showing read operations of the edge sense amplifiers S/AE1 and S/AE2 according to the second embodiment of the present invention. The second embodiment is different from the first embodiment in that the timing of activating the signal SHORT is delayed. The configuration and operations of the second embodiment other than the above difference are identical to the configuration and corresponding operations of the first embodiment.

In the first embodiment, the initial sensing period in the edge sense amplifiers S/AE1 and S/AE2 is longer than that of the sense amplifier S/A. A reason for this explained below with reference to the edge sense amplifier S/AE2 shown in FIG. 5. The edge sense amplifier S/AE2 has the first bit lines BL1s connected to the sense node SNL side, and has the edge bit lines BLEs connected to the sense node SNR side. Therefore, the capacitance of the bit lines connected to the sense node SNR side (capacitance of the bit lines transmitting the reference data) is smaller than the capacitance of the bit lines connected to the sense node SNL side (capacitance of the bit lines transmitting the information data to be read). Because the capacitance of the bit lines connected to the sense node SNR side is smaller, when the short-circuit transistor Tshort becomes the off state substantially at the same time as the operation of the load circuit CLC or before this operation, in the read operation, the potential of the sense node SNR is stabilized at the potential of the reference data (intermediate potential between the data "0" and the data "1") during a short time as shown in FIG. 8, without becoming lower than the potential of the reference data. When the potential of the sense node SNR is stabilized in a short time without becoming lower than the potential of the reference data, the amount of current flowing to the transistors TP3 and TP4 constituting the load circuit CLC becomes smaller. Therefore, it takes time to increase the potentials of the first bit lines BL1s connected to the sense node SNL side (potential of the sense node NSL "0"). Accordingly, in the first embodiment, the initial sensing period in the edge sense amplifier S/AE2 becomes relatively long. For the similar reason, the initial sensing period in the edge sense amplifier S/AE1 also becomes relatively long.

On the other hand, when the capacitance of the edge bit line BLE connected to the sense node SNR side is equal to the capacitance of the first bit lines BL1s connected to the sense node SNL side, the potential of the sense node SNR once becomes lower than a predetermined potential of the reference data, and then increases to the potential of the reference data, in a similar manner to that of the potential of the sense node as shown in FIG. 7. In this case, because the current amount supplied from the load circuit CLC becomes large, the load of the first bit lines BL1s connected to the sense node SNL side (potential of the sense node NSL "0") increases in a relatively short time.

As explained above, in the edge sense amplifier according to the first embodiment, the initial sensing period becomes long. On the other hand, in the second embodiment, the activation of the signal SHORT is delayed to shorten the initial sensing period in the edge sense amplifiers S/AE1 and S/AE2, as shown in FIG. 9 and FIG. 10. The short circuit switch Tshort short-circuits between the sense nodes SNL and SNR up to an optional time during a period from when the edge sense amplifier S/AE1 (or S/AE2) starts passing a current to the two bit lines BLE and BL1 (or BLE and BL2) connected to both sides of the edge sense amplifier S/AE1 (or S/AE2) until when the edge sense amplifier S/AE1 (or S/AE2) detects data based on a potential difference generated in the two bit lines BLE and BL1.

More specifically, in FIGS. 9 and 10, at time about 7 ns, the signal ΦT is activated, and the transfer gates TGL1 and TGR1 become the on state. At this time, the word line WL of a certain address is selected, and the load circuit CLC is activated by the signal BLOADON.

However, at this time, the signal SHORT maintains the active state (high level potential). That is, the short-circuit transistor Tshort short circuits between the sense nodes SNR and SNL in a similar manner to that in the precharge time. When the sense nodes SNR and SNL are short-circuited in this way, the potential of the sense node SNR becomes equal to that of SNL. Accordingly, during a period while the sense nodes SNR and SNL are short-circuited, a current from the load circuit CLC simultaneously increases the potential of the sense node SNL together with the potential of SNR via the short-circuit transistor Tshort, without increasing the potential of the low-capacitance edge bit line BLE (potential of the sense node SNL) faster than the potential of the high-capacitance bit lines BL1s (or BL2s). As a result, as shown in FIG. 10, the initial sensing period of the edge sense amplifiers S/AE1 and S/AE2 becomes a short period like that of the sense amplifier S/A.

Thereafter, at time about 9 ns, the signal SHORT is inactivated. Accordingly, a signal difference (a potential difference) is developed between the sense nodes SNR and SNL. The signal SHORT can be activated at an optional time during a period from when the transfer gates TGL1 and TGR1 and the load circuit CLC are turned on until when the latch circuit is driven. Because the signal difference between the sense nodes SNR and SNL needs to be developed to a sufficiently large size to detect this signal difference, a period from when the signal SHORT is inactivated until when the latch circuit is driven requires a certain level of length. Therefore, one of the optimum points in time for inactivating the signal SHORT is when the bit line potential connected to the read cell and the reference cell reaches substantially a steady state. Inactivating the signal SHORT substantially earlier than this time has a risk of not sufficiently exhibiting the effect of the second embodiment. On the other hand, inactivating the signal SHORT substantially later than this time delays the reading speed, and this is not preferable.

In the second embodiment, the operation speed of the edge sense amplifiers S/AE1 and S/AE2 is equal to that of the sense amplifier S/A. Therefore, the access speed to the memory cell arrays MCA1 and MCA3 at both sides of the arrangement of the memory cell arrays is equal to the access speed to the other access memory cell array MCA2. Further, the second embodiment can achieve effects identical to those of the first embodiment.

When the FBC memory is a product with a low operation speed, the first embodiment can be applied thereto, and when the FBC memory is a device that requires a high speed operation, it is preferable that the second embodiment is applied thereto.

(Modification)

In the above embodiments, at the initial sensing period, the bit lines within a memory cell array are activated alternately, and other bit lines within the memory cell array are set to an inactive state or fixed to a potential at the restoration period.

However, when the capacitance coupling between the adjacent bit lines BLs is not so large as to cause an erroneous detection of data, like in the present modification, the sense amplifier can activate the whole bit lines BLs within the memory cell array. That is, data can be read from the whole memory cells connected to the word lines WLs to be read. In this case, data can be read in a short time from the whole memory cells connected to the word lines WLs to be read. That is, a cycle time after the data of a certain word line WL is read and precharged until when the data is read again can be shortened.

The configuration and other operations of the present modification can be identical to those of the first or second embodiment. However, in this modification, in the intermediate array other than the edge arrays in the arrangement of the memory cell arrays, all bit line BLs to be read are simultaneously charged. On the other hand, the bit lines BLs at the reference side are charged alternately (intermittently), and potentials of other bit lines are fixed. Therefore, when the short-circuit switch Tshort is disconnected simultaneously with the starting of the initial sensing operation like that in the first embodiment, the potentials of the bit lines BLs to be read change in a relatively short time. However, a change of the potential of the bit lines BLs at the reference side is relatively slow. FIGS. 11A and 11B show results of a simulation showing a read operation of the sense amplifier S/A when the short-circuit switch Tshort is disconnected simultaneously with the starting of the initial sensing operation.

To handle a delay of a potential change of the bit lines BLs at the reference side, it is preferable to delay the activation of the signal SHORT, in a similar manner to that of the second embodiment, in the intermediate array other than the edge arrays in the arrangement of the memory cell arrays.

Figure 12A:
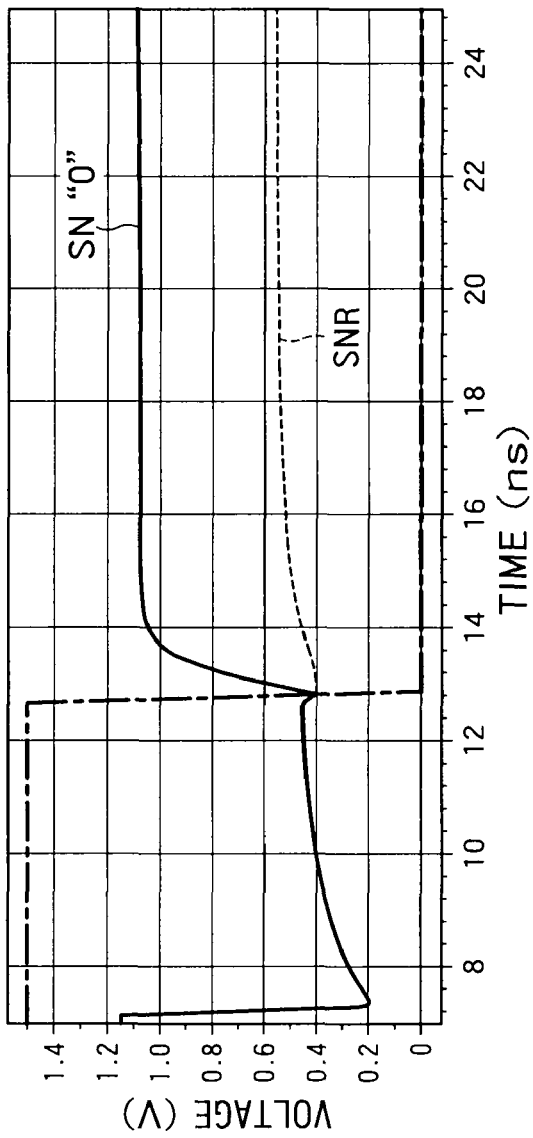
FIGS. 12A and 12B show results of a simulation showing a read operation of the sense amplifier S/A when the short-circuit switch Tshort is disconnected after starting the initial sensing operation.
Figure 12B:
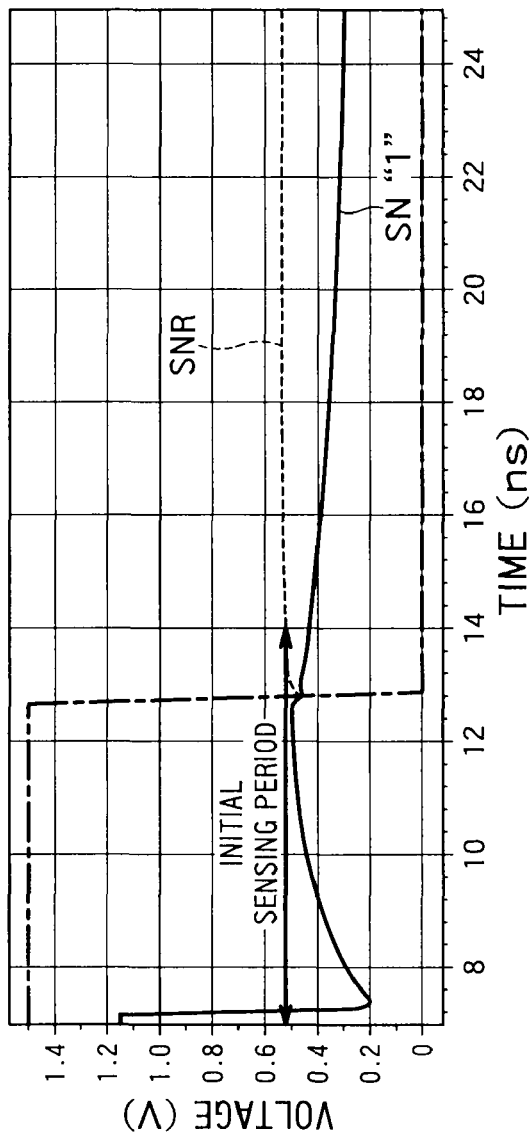

FIGS. 12A and 12B show results of a simulation showing a read operation of the sense amplifier S/A when the short-circuit switch Tshort is disconnected after starting the initial sensing operation. The short-circuit switch Tshort short-circuits between the sense nodes SNL and SNR up to an optional time during a period from when the sense amplifier starts passing a current to two bit lines connected to both sides of this sense amplifier until when data is detected based on a potential difference generated in the two bit lines. With this arrangement, the initial sensing period can be shortened in the intermediate array, for a similar reason to that explained in the second embodiment. This modification can be applied to both the first and second embodiments.

The invention claimed is:

1. A semiconductor memory device comprising:
    a plurality of memory cell arrays having a plurality of memory cells two-dimensionally arranged, each of the memory cell comprising a source, a drain, and a gate, including a floating body in an electrically floating state, and storing data based on number of carriers within the floating body;
    a plurality of word lines connected to the gates of the memory cells and arranged towards a first direction;
    a plurality of first bit lines and a plurality of second bit lines respectively connected to the sources or the drains of the memory cells, and arranged alternately towards a second direction intersecting with the first direction;
    first sense amplifiers arranged in a first interval of an arrangement of the memory cell arrays, each first sense amplifier being connected to the first bit lines respectively corresponding to two memory cell arrays provided at both sides of the first sense amplifier, each first sense amplifier detecting data from one of the two memory cell arrays on the basis of reference data from the other of the two memory cell arrays;
    second sense amplifiers arranged in a second interval of the arrangement of the memory cell arrays, each second sense amplifier being connected to the second bit lines respectively corresponding to two memory cell arrays at both sides of the second sense amplifier, each second sense amplifier detecting data from one of the two memory cell arrays on the basis of reference data from the other of the two memory cell arrays;
    edge arrays provided beside both ends of an arrangement of the memory cell arrays, the edge arrays generating only the reference data; and
    edge sense amplifiers provided between the arrangement of the memory cell arrays and the edge arrays, wherein the edge sense amplifier detects data from the memory cell array at one end of the memory cell arrays based on the reference data from one of the edge arrays.

2. The semiconductor memory device according to claim 1, wherein the edge bit lines provided in the edge arrays are shorter than the first and the second bit lines.

3. The semiconductor memory device according to claim 1, wherein
    the first sense amplifier passes a current to two of the first bit lines connected to both sides of the first sense amplifier, and detects data based on a potential difference generated in the two first bit lines,
    the second sense amplifier passes a current to two of the second bit lines connected to both sides of the second sense amplifier, and detects data based on a potential difference generated in the two second bit lines, and the edge sense amplifier passes a current to the first or the second bit lines of the memory cell array at one end of the arrangement of the memory cell arrays, and to the edge bit line provided at the edge array, and detects data based on a potential difference generated in the two bit lines.

4. The semiconductor memory device according to claim 3, wherein the edge sense amplifier includes, two sense nodes propagating data of the two bit lines connected to both sides of the edge sense amplifier; and a short-circuit switch connected between the two sense nodes, wherein the short-circuit switch short-circuits between the two sense nodes up to an optional point in time during a period from when the edge sense amplifier starts passing a current to two bit lines connected to both sides of the edge sense amplifier until when data is detected based on a potential difference generated in the two bit lines.

5. The semiconductor memory device according to claim 3, wherein the first sense amplifier includes two sense nodes propagating data of two bit lines connected to both sides of the first sense amplifier, and a short-circuit switch connected between the two sense nodes, the second sense amplifier includes two sense nodes propagating data of two bit lines connected to both sides of the second sense amplifier, and a short-circuit switch connected between the two sense nodes, and the short-circuit switch short-circuits between the two sense nodes up to an optional point in time during a period from when the first or second sense amplifier starts passing a current to two bit lines connected to both sides of the sense amplifier until when data is detected based on a potential difference generated in the two bit lines.

6. The semiconductor memory device according to claim 4, wherein the first sense amplifier includes two sense nodes propagating data of two bit lines connected to both sides of the first sense amplifier, and a short-circuit switch connected between the two sense nodes, the second sense amplifier includes two sense nodes propagating data of two bit lines connected to both sides of the second sense amplifier, and a short-circuit switch connected between the two sense nodes, and the short-circuit switch short-circuits between the two sense nodes up to an optional point in time during a period from when the first or second sense amplifier starts passing a current to two bit lines connected to both sides of the sense amplifier until when data is detected based on a potential difference generated in the two bit lines.

7. The semiconductor memory device according to claim 1, wherein at a data reading time, the first sense amplifier activates the first bit line and detects data via the first bit line in a state that a voltage of the second bit line is fixed, and after data of the first bit line is detected, the second sense amplifier activates the second bit line and detects data via the second bit line in a state that a voltage of the first bit line is fixed.

8. The semiconductor memory device according to claim 2, wherein at a data reading time, the first sense amplifier activates the first bit line and detects data via the first bit line in a state that a voltage of the second bit line is fixed, and after data of the first bit line is detected, the second sense amplifier activates the second bit line and detects data via the second bit line in a state that a voltage of the first bit line is fixed.

9. The semiconductor memory device according to claim 1, wherein capacitance of the edge bit line provided in the edge array is smaller than capacitances of the first and the second bit lines.

10. A method of driving a semiconductor memory device, the semiconductor memory device comprising: a plurality of memory cell arrays formed by having a plurality of memory cells arranged two dimensionally, the memory cells including floating bodies in electrically floating states; a plurality of word lines connected to gates of the memory cells; a plurality of first bit lines and a plurality of second bit lines respectively connected to sources or drains of the memory cells; edge arrays provided beside both ends of an arrangement of the memory cell arrays; and edge sense amplifiers provided between the arrangement of the memory cell arrays and the edge arrays, the method comprising:

detecting data from a memory cell array at one end of the arrangement of the memory cell arrays based on reference data from one of the edge arrays.

11. The method of driving a semiconductor memory device according to claim 10, wherein the semiconductor memory device further comprises first sense amplifiers arranged in first intervals of the arrangement of the memory cell arrays, and second sense amplifiers arranged in second intervals of the arrangement of the memory cell arrays, wherein the method further comprises:

detecting data from one of the two memory cell arrays on the basis of reference data from the other of the two memory cell arrays at both sides of the first sense amplifier; and detecting data from one of the two memory cell arrays on the basis of reference data from the other of memory cell arrays at both sides of the second sense amplifier.

12. The method of driving a semiconductor memory device according to claim 11, wherein the first sense amplifier passes a current to two of the first bit lines connected to both sides of the first sense amplifier, and detects data based on a potential difference generated in the two first bit lines, the second sense amplifier passes a current to two of the second bit lines connected to both sides of the second sense amplifier, and detects data based on a potential difference generated in the two second bit lines, and the edge sense amplifier passes a current to the first or the second bit lines of the memory cell array at one end of the arrangement of the memory cell arrays, and to the edge bit line provided at the edge array, and detects data based on a potential difference generated in the two bit lines.

13. The method of driving a semiconductor memory device according to claim 10, wherein the edge sense amplifier includes:

two sense nodes propagating data of the two bit lines connected to both sides of the edge sense amplifier; and a short-circuit switch connected between the two sense nodes, wherein the short-circuit switch short-circuits between the two sense nodes up to an optional point in time during a period from when the edge sense amplifier starts passing a current to two bit lines connected to both sides of the edge sense amplifier until when data is detected based on a potential difference generated in the two bit lines.

14. The method of driving a semiconductor memory device according to claim 11, wherein the edge sense amplifier includes:
two sense nodes propagating data of the two bit lines connected to both sides of the edge sense amplifier; and
a short-circuit switch connected between the two sense nodes, wherein
the short-circuit switch short-circuits between the two sense nodes up to an optional point in time during a period from when the edge sense amplifier starts passing a current to two bit lines connected to both sides of the edge sense amplifier until when data is detected based on a potential difference generated in the two bit lines.

15. The method of driving a semiconductor memory device according to claim 12, wherein
the edge sense amplifier includes:
two sense nodes propagating data of the two bit lines connected to both sides of the edge sense amplifier; and
a short-circuit switch connected between the two sense nodes, wherein
the short-circuit switch short-circuits between the two sense nodes up to an optional point in time during a period from when the edge sense amplifier starts passing a current to two bit lines connected to both sides of the edge sense amplifier until when data is detected based on a potential difference generated in the two bit lines.

16. The method of driving a semiconductor memory device according to claim 11, wherein
the first sense amplifier includes two sense nodes propagating data of two bit lines connected to both sides of the first sense amplifier, and a short-circuit switch connected between the two sense nodes,
the second sense amplifier includes two sense nodes propagating data of two bit lines connected to both sides of the second sense amplifier, and a short-circuit switch connected between the two sense nodes, and
the short-circuit switch short-circuits between the two sense nodes up to an optional point in time during a period from when the first or second sense amplifier starts passing a current to two bit lines connected to both sides of the sense amplifier until when data is detected based on a potential difference generated in the two bit lines.

17. The method of driving a semiconductor memory device according to claim 12, wherein
the first sense amplifier includes two sense nodes propagating data of two bit lines connected to both sides of the first sense amplifier, and a short-circuit switch connected between the two sense nodes,
the second sense amplifier includes two sense nodes propagating data of two bit lines connected to both sides of the second sense amplifier, and a short-circuit switch connected between the two sense nodes, and
the short-circuit switch short-circuits between the two sense nodes up to an optional point in time during a period from when the first or second sense amplifier starts passing a current to two bit lines connected to both sides of the sense amplifier until when data is detected based on a potential difference generated in the two bit lines.

18. The method of driving a semiconductor memory device according to claim 11, wherein at a data reading time, the first sense amplifier activates the first bit line and detects data via the first bit line in a state that a voltage of the second bit line is fixed, and
after data of the first bit line is detected, the second sense amplifier activates the second bit line and detects data via the second bit line in a state that a voltage of the first bit line is fixed.

19. The method of driving a semiconductor memory device according to claim 11, wherein capacitance of the edge bit line provided in the edge array is smaller than capacitances of the first and the second bit lines.

* * * * *